US010712396B2

(12) United States Patent
Battle et al.

(10) Patent No.: US 10,712,396 B2
(45) Date of Patent: Jul. 14, 2020

(54) METHODS, SYSTEMS, AND DEVICES FOR MONITORING STATE-OF-HEALTH OF A BATTERY SYSTEM OPERATING OVER AN EXTENDED TEMPERATURE RANGE

(71) Applicant: NDSL, Inc., Raleigh, NC (US)

(72) Inventors: David Robert Battle, Durham, NC (US); Sumner Michael Smith, Henderson, NC (US); Dat Tan Chau, Raleigh, NC (US); Mark Allen Wille, Angier, NC (US)

(73) Assignee: NDSL, Inc., Raleigh, NC (US)

( * ) Notice: Subject to any disclaimer, the term of this patent is extended or adjusted under 35 U.S.C. 154(b) by 0 days.

(21) Appl. No.: 16/411,471

(22) Filed: May 14, 2019

(65) Prior Publication Data

US 2019/0383881 A1 Dec. 19, 2019

Related U.S. Application Data

(60) Provisional application No. 62/677,489, filed on May 29, 2018.

(51) Int. Cl.
*G01R 31/392* (2019.01)
*G01R 31/374* (2019.01)
(Continued)

(52) U.S. Cl.
CPC ......... *G01R 31/392* (2019.01); *G01R 31/374* (2019.01); *G01R 31/389* (2019.01);
(Continued)

(58) Field of Classification Search
CPC .. G01R 31/389; G01R 31/392; G01R 31/396; G01R 31/3842; G01R 31/374; H01M 10/486; G06F 3/048
See application file for complete search history.

(56) References Cited

U.S. PATENT DOCUMENTS 5,717,313 A * 2/1998 Grabon ................. H02J 7/0091
320/150
7,199,557 B2 4/2007 Anbuky et al.
(Continued)

FOREIGN PATENT DOCUMENTS

CN 101208847 A 6/2008
CN 102156265 A 8/2011
(Continued)

OTHER PUBLICATIONS

PCT, International Search Report and Written Opinion in International Application No. PCT/US2019/032153 dated Sep. 12, 2019.
(Continued)

*Primary Examiner* — Kyle R Quigley
(74) *Attorney, Agent, or Firm* — NK Patent Law

(57) ABSTRACT

Disclosed herein are methods, systems, and devices for determining a state-of-health (SOH) of battery systems over extended temperatures. According to one embodiment, a computer implemented method includes (1) receiving measured temperature data and measured ohmic value data associated with a battery cell; (2) determining an estimated battery cell electrolyte temperature based on the measured temperature data; (3) determining a normalized ohmic value based on the measured ohmic value data and the estimated battery cell electrolyte temperature, wherein the normalized ohmic value is related to a normalized temperature; and (4) transmitting, to at least one of a graphical user interface (GUI) and a battery log, an indication of an SOH of the battery cell based upon the normalized ohmic value being greater than a normalized maximum ohmic value, wherein the normalized maximum ohmic value is indicative of an abnormal SOH of the battery cell for the normalized temperature.

25 Claims, 7 Drawing Sheets

(51) Int. Cl.
*G06F 3/048* (2013.01)
*G01R 31/396* (2019.01)
*G01R 31/3842* (2019.01)
*G01R 31/389* (2019.01)

(52) U.S. Cl.
CPC ....... *G01R 31/3842* (2019.01); *G01R 31/396* (2019.01); *G06F 3/048* (2013.01)

(56) References Cited

U.S. PATENT DOCUMENTS

| | | | |
|---|---|---|---|
| 7,218,078 | B2 | 5/2007 | Gagnon et al. |
| 8,040,110 | B2 | 10/2011 | Al-Anbuky et al. |
| 9,791,513 | B2 | 10/2017 | Maluf et al. |
| 9,791,519 | B2 | 10/2017 | Kelly |
| 2002/0153865 | A1* | 10/2002 | Nelson .................. H02J 9/062 320/152 |
| 2009/0224771 | A1* | 9/2009 | Deveau ................ G01R 31/386 324/600 |
| 2011/0148424 | A1 | 6/2011 | Chiang et al. |
| 2011/0172939 | A1* | 7/2011 | Uprety ................ H01M 10/486 702/63 |
| 2012/0072145 | A1 | 3/2012 | Zhang et al. |
| 2012/0251876 | A1 | 10/2012 | Jagannathan |
| 2015/0372317 | A1 | 12/2015 | Pozin et al. |
| 2016/0380313 | A1 | 12/2016 | Morita et al. |
| 2017/0199246 | A1 | 7/2017 | Hindle et al. |
| 2017/0237091 | A1 | 8/2017 | Zhang et al. |

FOREIGN PATENT DOCUMENTS

| | | |
|---|---|---|
| CN | 105785275 A1 | 7/2016 |
| WO | 2007006121 A1 | 1/2007 |
| WO | 2013173604 A1 | 11/2016 |
| WO | 2016183076 A1 | 11/2016 |

OTHER PUBLICATIONS

Air Force Pamphlet 32/1186, "Valve-Regulated Lead-Acid Batteries for Stationary Applications", Aug. 1, 1999, 72 pages.

Sheng, Su, "Photovoltaic Nanogrid: Parallel Operating Inverters and Energy Management Flow" Northeastern University: The Department of Electrical Computer Engineering, Mar. 2017, 235 pages.

Telecommunication Engineering Centre, Characterization of VRLA Batteries and Guidelines for the O&M of VRLA Batteries, Mar. 2014, 41 pages.

Leng, Feng, et al., "Effect of Temperature on the Aging rate of Li Ion Battery Operating above Room Temperature", Scientific Reports, Aug. 6, 2015, 12 pages.

Battery University, "BU-410: Charging at High and Low Temperatures", accessed: https://batteryuniversity.com/index.php/learn/article/charging_at_high_and_low_temperatures, Sep. 15, 2017, 7 pages.

Fukuda Batteries, "Installation, Operating & Maintenance Instructions: for Valve Regulated Lead Acid Batteries", Powermark Battery & Hardware Trading, Pte. Ltd., Mar. 1, 2017, 11 pages.

IEEE Standards Board, "IEEE Guide for the Selection and Sizing of Batteries for Uninterruptible Power Systems", Engery Development and Power Generation Committee of the IEEE Power Engingeering Society, Dec. 19, 1994, 35 pages.

Samolyk, Mateusz Michal, et al., "Development of an algorithm for estimating Lead-Acid Battery State of Charge and State of Health.", Blekinge Institute of Technology, Sep. 2013, 81 pages.

* cited by examiner

METHODS, SYSTEMS, AND DEVICES FOR MONITORING STATE-OF-HEALTH OF A BATTERY SYSTEM OPERATING OVER AN EXTENDED TEMPERATURE RANGE

PRIORITY CLAIM

This application claims priority to U.S. Provisional Patent Application Ser. No. 62/677,489 filed May 29, 2018, the disclosure of which is incorporated herein by reference in its entirety.

TECHNICAL FIELD

The present invention relates generally to battery monitoring systems for battery power systems. More specifically; methods, systems, and devices are disclosed for determining a state-of-heath of a battery cell and/or battery container using an ohmic value measurement.

BACKGROUND

A battery or battery system containing one or more failing battery cells and/or containers may not be capable of providing power at rated operating voltages, currents, and/or time durations. For example, lead acid batteries lose their ability to accept a charge when discharged over a period of time. Even if maintained on a battery charger, lead acid batteries will eventually fail over time due to sulfation. Ohmic value also known as internal cell resistance or impedance and cell conductance. When a battery cell starts to fail the internal resistance of the battery cell increases. Ohmic value is known to be temperature dependent.

One usage for lead acid batteries is within high capacity uninterrupted power supply (UPS) systems. Typically, the high capacity UPS system is provided in the form of a number of lead acid battery cells electrically connected in series. Historically, these lead acid batteries have been characterized for an operating temperature like 77° Fahrenheit (25° Celsius) and are often used in a climate-controlled environment. A battery monitoring system may be used with the high capacity UPS system to routinely check and determine a state-of-health for each cell by measuring the cell ohmic value at 77 F. As such, dying cells can be detected and replaced prior to a failure. However, there are applications which use the battery and charger systems in extended temperature environments without climate control.

As such, new methods, systems, and devices are needed to better determine the state-of-health of battery systems (e.g. high capacity UPS systems) over extended temperature ranges. Additionally, other outdoor batteries may benefit such as vehicle batteries.

SUMMARY

Disclosed herein are methods, systems, and devices for solving the problem of better determining the state-of-health of battery systems (e.g. high capacity UPS systems) over extended temperature ranges.

According to one embodiment, a method is implemented on at least one computing device for determining a battery cell state-of-health status. The method includes (1) receiving first measured temperature data and first measured ohmic value data associated with a first battery cell; (2) determining a first estimated battery cell electrolyte temperature based on the first measured temperature data; (3) determining a first normalized ohmic value based at least partially on the first measured ohmic value data and the first estimated battery cell electrolyte temperature, wherein the first normalized ohmic value is related to a normalized temperature; and (4) transmitting, to at least one of a graphical user interface (GUI) and a battery log, an indication of a state-of-health of the first battery cell based upon the first normalized ohmic value being greater than a normalized maximum ohmic value, wherein the normalized maximum ohmic value is indicative of an abnormal state-of-health of the first battery cell for the normalized temperature. Additionally the first battery cell may be a lead acid battery cell implemented in a battery container. The normalized maximum ohmic value may also be adjusted based upon an age of the first battery cell and/or a specific gravity of the first battery cell.

In some embodiments, the first measured temperature data may include first ambient air temperature data and first negative post temperature data associated with the first battery cell. The first measured temperature data may be collected over at least a two hour interval. In other embodiments, the first measured temperature data may be collected over at least a four hour interval. In further embodiments, the first measured temperature data may be collected over at least a twenty-four hour interval.

In some embodiments, determining the first normalized ohmic value may also be based on a temperature coefficient and a delta of the first estimated battery cell electrolyte temperature and the normalized temperature. The temperature coefficient may be a value between −0.9 and −2.0 micro-ohms per degree Fahrenheit. In other embodiments, the temperature coefficient may be a value between −1.1 and −1.3 micro-ohms per degree Fahrenheit. The temperature coefficient may also be determined by the computing device during a battery break-in period and the battery break-in period may be a time interval less than six months after initial battery cell installation. The temperature coefficient may be further determined by the computing device over an ambient temperature range greater than 40 degrees Fahrenheit during the battery break-in period.

In some embodiments, the method may also include receiving a first battery type associated with the first battery cell. In this embodiment the temperature coefficient may be at least partially based upon the first battery type. The first normalized ohmic value may be determined using an algorithm including the first battery type, and a delta of the first estimated battery cell electrolyte temperature and the normalized temperature. The algorithm may include at least one of a sigmoid function, a linear function, a quadratic function, a power function, a polynomial function, a rational function, an exponential function, a logarithmic function, and a sinusoidal function. The algorithm may be implemented using a lookup table. The normalized temperature may be approximately 77 degrees Fahrenheit. In other embodiments, the normalized temperature may be between 70 and 80 degrees Fahrenheit. In further embodiments, the normalized temperature may be between 60 and 90 degrees Fahrenheit. Additionally, determining the first normalized ohmic value may be further based at least partially upon an age of the first battery cell.

In some embodiments, the method may further include receiving second measured temperature data associated with a second battery cell that is collocated with the first battery cell and determining the first estimated battery cell electrolyte temperature may be further based on the second measured temperature data associated with the second battery cell. The second measured temperature data may include second negative post temperature data associated with the second battery cell. In certain embodiments, the second measured temperature data may also include second ambient air temperature data associated with the second battery cell in addition to the first ambient air temperature data associated with the first battery cell.

In some embodiments, the second battery cell may be electrically coupled in series with the first battery cell and the method may further include (1) receiving second measured ohmic value data associated with the second battery cell and the second measured temperature data; (2) determining a second estimated battery cell electrolyte temperature based on the first measured temperature data and the second measured temperature data; (3) determining a second normalized ohmic value based at least partially on the first measured ohmic value data and the second estimated battery cell electrolyte temperature, wherein the second normalized ohmic value is related to the normalized temperature; and (4) transmitting, to at least one of the GUI and the battery log, an indication of a state-of-health of the second battery cell based upon the second normalized ohmic value being greater than the normalized maximum ohmic value and the first normalized ohmic value being less than the normalized maximum ohmic value.

In some embodiments, the first normalized ohmic value may be further determined based on a steady-state temperature status using a known thermal mass of the first battery cell. In other embodiments, the first measured ohmic value data associated with the first battery cell and the first measured temperature data may be based on a predetermined temperature value and a known temperature coefficient for the known temperature value.

According to another embodiment, a computing device includes a memory and at least one processor configured to provide a method for determining a battery cell state-of-health status. The method includes (1) receiving first measured temperature data and first measured ohmic value data associated with a first battery cell; (2) determining a first estimated battery cell electrolyte temperature based on the first measured temperature data; (3) determining a first normalized ohmic value based at least partially on the first measured ohmic value data and the first estimated battery cell electrolyte temperature, wherein the first normalized ohmic value is related to a normalized temperature; and (4) transmitting, to at least one of a GUI and a battery log, an indication of a state-of-health of the first battery cell based upon the first normalized ohmic value being greater than a normalized maximum ohmic value, wherein the normalized maximum ohmic value is indicative of an abnormal state-of-health of the first battery cell for the normalized temperature.

According to another embodiment, a non-transitory computer-readable storage medium stores instructions to be implemented on at least one computing device including at least one processor. The instructions when executed by the at least one processor cause the at least one computing device to provide a method for determining a battery cell state-of-health status. The method includes (1) receiving first measured temperature data and first measured ohmic value data associated with a first battery cell; (2) determining a first estimated battery cell electrolyte temperature based on the first measured temperature data; (3) determining a first normalized ohmic value based at least partially on the first measured ohmic value data and the first estimated battery cell electrolyte temperature, wherein the first normalized ohmic value is related to a normalized temperature; and (4) transmitting, to at least one of a GUI and a battery log, an indication of a state-of-health of the first battery cell based upon the first normalized ohmic value being greater than a normalized maximum ohmic value, wherein the normalized maximum ohmic value is indicative of an abnormal state-of-health of the first battery cell for the normalized temperature.

According to another embodiment, a method is implemented on at least one computing device for determining a battery cell state-of-health status. The method includes (1) receiving first measured temperature data and first measured ohmic value data associated with a first battery cell; (2) determining a first estimated battery cell electrolyte temperature based on the first measured temperature data; and (3) transmitting, to at least one of a GUI and a battery log, an indication of a state-of-health of the first battery cell based upon the first measured ohmic value being greater than a temperature compensated maximum ohmic value. The temperature compensated maximum ohmic value is derived from a normalized maximum ohmic value for a normalized temperature and the normalized maximum ohmic value is indicative of an abnormal state-of-health of the first battery cell for the normalized temperature. Additionally the first battery cell may be a lead acid battery cell. The normalized maximum ohmic value may also be adjusted based upon an age of the first battery cell and/or a specific gravity of the first battery cell.

According to another embodiment, a computing device includes a memory and at least one processor configured to provide a method for determining a battery cell state-of-health status. The method includes (1) receiving first measured temperature data and first measured ohmic value data associated with a first battery cell; (2) determining a first estimated battery cell electrolyte temperature based on the first measured temperature data; and (3) transmitting, to at least one of a GUI and a battery log, an indication of a state-of-health of the first battery cell based upon the first measured ohmic value being greater than a temperature compensated maximum ohmic value. The temperature compensated maximum ohmic value is derived from a normalized maximum ohmic value for a normalized temperature and the normalized maximum ohmic value is indicative of an abnormal state-of-health of the first battery cell for the normalized temperature.

According to another embodiment, a non-transitory computer-readable storage medium stores instructions to be implemented on at least one computing device including at least one processor. The instructions when executed by the at least one processor cause the at least one computing device to provide a method for determining a battery cell state-of-health status. The method includes (1) receiving first measured temperature data and first measured ohmic value data associated with a first battery cell; (2) determining a first estimated battery cell electrolyte temperature based on the first measured temperature data; and (3) transmitting, to at least one of a GUI and a battery log, an indication of a state-of-health of the first battery cell based upon the first measured ohmic value being greater than a temperature compensated maximum ohmic value. The temperature compensated maximum ohmic value is derived from a normalized maximum ohmic value for a normalized temperature and the normalized maximum ohmic value is indicative of an abnormal state-of-health of the first battery cell for the normalized temperature.

According to another embodiment, a method is implemented on at least one computing device for determining a battery container state-of-health status. The method includes (1) receiving first measured temperature data and first measured ohmic value data associated with a first battery container; (2) determining a first estimated battery container electrolyte temperature based on the first measured temperature data; (3) determining a first normalized ohmic value based at least partially on the first measured ohmic value data and the first estimated battery container electrolyte temperature, wherein the first normalized ohmic value is related to a normalized temperature; and (4) transmitting, to at least one of a GUI and a battery log, an indication of a state-of-health of the first battery container based upon the first normalized ohmic value being greater than a normalized maximum ohmic value The normalized maximum ohmic value is indicative of an abnormal state-of-health of the first battery container for the normalized temperature. Additionally the first battery container may be a lead acid battery container. The normalized maximum ohmic value may also be adjusted based upon an age of the first battery container and/or a specific gravity of the first battery container.

According to another embodiment, a computing device includes a memory and at least one processor configured to provide a method for determining a battery container state-of-health status. The method includes (1) receiving first measured temperature data and first measured ohmic value data associated with a first battery container; (2) determining a first estimated battery container electrolyte temperature based on the first measured temperature data; (3) determining a first normalized ohmic value based at least partially on the first measured ohmic value data and the first estimated battery container electrolyte temperature, wherein the first normalized ohmic value is related to a normalized temperature; and (4) transmitting, to at least one of a GUI and a battery log, an indication of a state-of-health of the first battery container based upon the first normalized ohmic value being greater than a normalized maximum ohmic value. The normalized maximum ohmic value is indicative of an abnormal state-of-health of the first battery container for the normalized temperature.

According to another embodiment, a non-transitory computer-readable storage medium stores instructions to be implemented on at least one computing device including at least one processor. The instructions when executed by the at least one processor cause the at least one computing device to provide a method for determining a battery cell state-of-health status. The method includes (1) receiving first measured temperature data and first measured ohmic value data associated with a first battery container; (2) determining a first estimated battery container electrolyte temperature based on the first measured temperature data; (3) determining a first normalized ohmic value based at least partially on the first measured ohmic value data and the first estimated battery container electrolyte temperature, wherein the first normalized ohmic value is related to a normalized temperature; and (4) transmitting, to at least one of a GUI and a battery log, an indication of a state-of-health of the first battery container based upon the first normalized ohmic value being greater than a normalized maximum ohmic value. The normalized maximum ohmic value is indicative of an abnormal state-of-health of the first battery container for the normalized temperature.

According to another embodiment, a method is implemented on at least one computing device for determining a battery container state-of-health status. The method includes (1) receiving first measured temperature data and first measured ohmic value data associated with a first battery container; (2) determining a first estimated battery container electrolyte temperature based on the first measured temperature data; and (3) transmitting, to at least one of a GUI and a battery log, an indication of a state-of-health of the first battery container based upon the first measured ohmic value being greater than a temperature compensated maximum ohmic value. The temperature compensated maximum ohmic value is derived from a normalized maximum ohmic value for a normalized temperature and the normalized maximum ohmic value is indicative of an abnormal state-of-health of the first battery container for the normalized temperature. Additionally the first battery container may be a lead acid battery container. The normalized maximum ohmic value may also be adjusted based upon an age of the first battery container and/or a specific gravity of the first battery container.

According to another embodiment, a computing device includes a memory and at least one processor configured to provide a method for determining a battery container state-of-health status. The method includes (1) receiving first measured temperature data and first measured ohmic value data associated with a first battery container; (2) determining a first estimated battery container electrolyte temperature based on the first measured temperature data; and (3) transmitting, to at least one of a GUI and a battery log, an indication of a state-of-health of the first battery container based upon the first measured ohmic value being greater than a temperature compensated maximum ohmic value. The temperature compensated maximum ohmic value is derived from a normalized maximum ohmic value for a normalized temperature and the normalized maximum ohmic value is indicative of an abnormal state-of-health of the first battery container for the normalized temperature.

According to another embodiment, a non-transitory computer-readable storage medium stores instructions to be implemented on at least one computing device including at least one processor. The instructions when executed by the at least one processor cause the at least one computing device to provide a method for determining a battery cell state-of-health status. The method includes (1) receiving first measured temperature data and first measured ohmic value data associated with a first battery container; (2) determining a first estimated battery container electrolyte temperature based on the first measured temperature data; and (3) transmitting, to at least one of a GUI and a battery log, an indication of a state-of-health of the first battery container based upon the first measured ohmic value being greater than a temperature compensated maximum ohmic value. The temperature compensated maximum ohmic value is derived from a normalized maximum ohmic value for a normalized temperature and the normalized maximum ohmic value is indicative of an abnormal state-of-health of the first battery container for the normalized temperature.

According to another embodiment, a method is implemented on at least one computing device for determining a battery container state-of-health status. The method includes; (1) receiving first measured temperature data associated with a first battery cell; (2) upon receiving a measured temperature value matching a predetermined temperature value, initiating a first ohmic value measurement for the first battery cell; (3) receiving a first measured ohmic value associated with the first ohmic value measurement; (4) determining a first delta value of the first measured ohmic value and a previously measured ohmic value associated with the predetermined temperature value; and (5) transmitting, to at least one of a graphical user interface (GUI) and a battery log, an indication of a state-of-health of the first battery cell based upon the first delta value being greater than a maximum delta value. The maximum delta value is indicative of an abnormal state-of-health of the first battery cell for the predetermined temperature value.

According to another embodiment, a computing device includes a memory and at least one processor configured to provide a method for determining a battery container state-of-health status. The method includes (1) receiving first measured temperature data associated with a first battery cell; (2) upon receiving a measured temperature value matching a predetermined temperature value, initiating a first ohmic value measurement for the first battery cell; (3) receiving a first measured ohmic value associated with the first ohmic value measurement; (4) determining a first delta value of the first measured ohmic value and a previously measured ohmic value associated with the predetermined temperature value; and (5) transmitting, to at least one of a graphical user interface (GUI) and a battery log, an indication of a state-of-health of the first battery cell based upon the first delta value being greater than a maximum delta value. The maximum delta value is indicative of an abnormal state-of-health of the first battery cell for the predetermined temperature value.

According to another embodiment, a non-transitory computer-readable storage medium stores instructions to be implemented on at least one computing device including at least one processor. The instructions when executed by the at least one processor cause the at least one computing device to provide a method for determining a battery cell state-of-health status. The method includes (1) receiving first measured temperature data associated with a first battery cell; (2) upon receiving a measured temperature value matching a predetermined temperature value, initiating a first ohmic value measurement for the first battery cell; (3) receiving a first measured ohmic value associated with the first ohmic value measurement; (4) determining a first delta value of the first measured ohmic value and a previously measured ohmic value associated with the predetermined temperature value; and (5) transmitting, to at least one of a graphical user interface (GUI) and a battery log, an indication of a state-of-health of the first battery cell based upon the first delta value being greater than a maximum delta value. The maximum delta value is indicative of an abnormal state-of-health of the first battery cell for the predetermined temperature value.

The features and advantages described in this summary and the following detailed description are not all-inclusive. Many additional features and advantages will be apparent to one of ordinary skill in the art in view of the drawings, specification, and claims presented herein.

BRIEF DESCRIPTION OF THE DRAWINGS

The present embodiments are illustrated by way of example and are not intended to be limited by the figures of the accompanying drawings. In the drawings.

DETAILED DESCRIPTION

Figure 1:
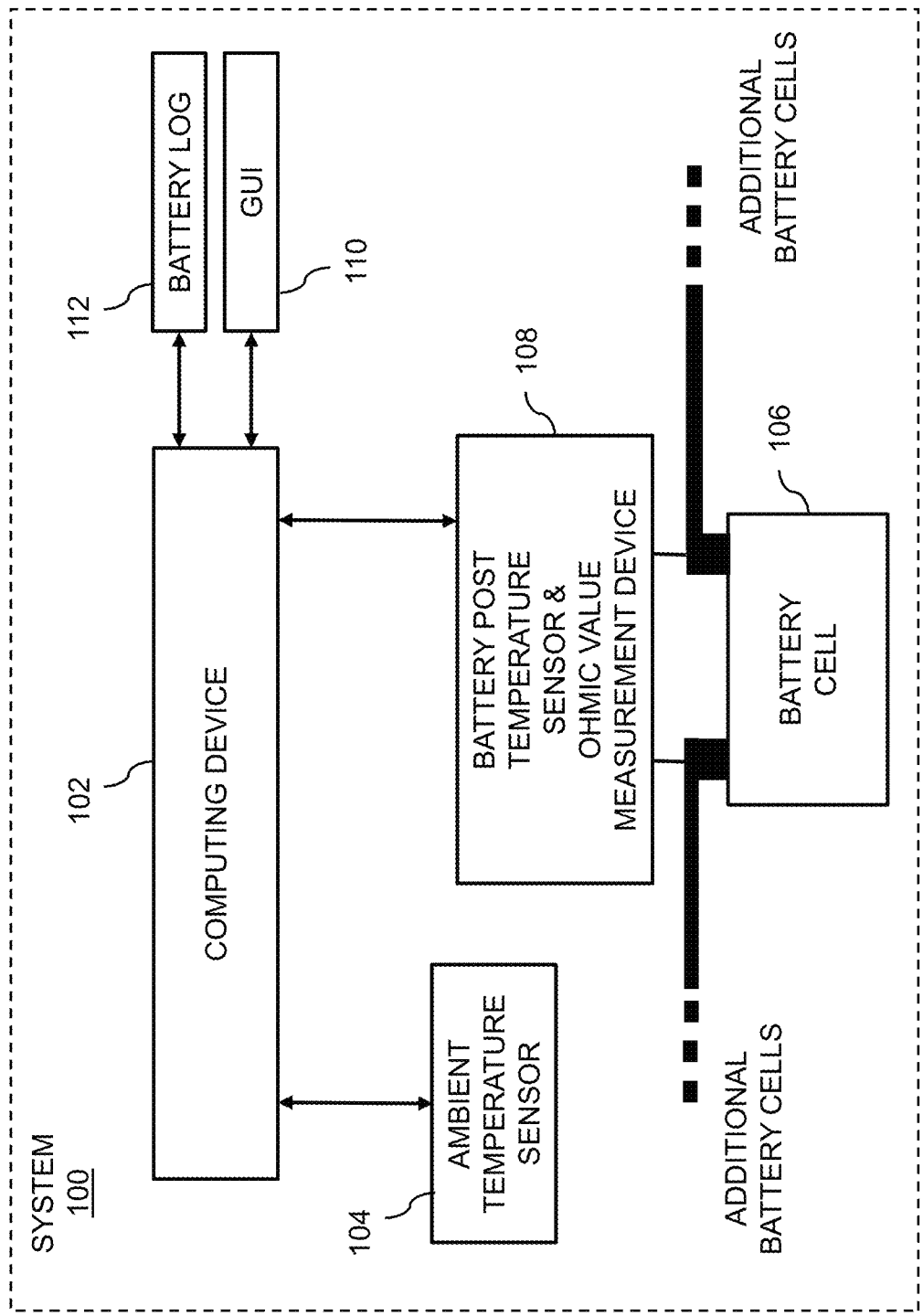
FIG. 1 depicts a block diagram illustrating a system in accordance with embodiments of the present disclosure.

The following description and drawings are illustrative and are not to be construed as limiting. Numerous specific details are described to provide a thorough understanding of the disclosure. However, in certain instances, well-known or conventional details are not described in order to avoid obscuring the description. References to "one embodiment" or "an embodiment" in the present disclosure can be, but not necessarily are, references to the same embodiment and such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions, will control.

The present invention relates to battery monitoring systems for battery power systems in non-climate controlled environments. Methods, systems, and devices are disclosed herein for determining a state-of-heath of a battery cell and/or battery container using an ohmic value measurement over extended temperature ranges.

Battery monitoring systems use routine measurements of temperature, voltage, current, and ohmic value to determine the state-of-health of battery cells in a battery power supply system. The state-of-health of an individual battery cell may be correlated with an ohmic value of the battery cell, such as an internal resistance, internal impedance, and/or internal conductance of the battery cell. Additionally, this ohmic value may or may not include the battery posts. The ohmic value of batteries may be monitored and trended over time. The batteries may be actively monitored by a battery monitoring systems and automatically recorded to a database forming a battery log. Alternately the batteries may be monitored by a technician using a handheld device. The readings from the handheld device may be automatically recorded to the database or the technician may manually enter the readings to the database. As the batteries age their ohmic value will rise due to the normal deterioration and the aging process. An important indicator of a failing battery cell is when the ohmic value reaches an increased percentage of its original value when first installed. As such, a battery cell that has been detected to have the impending failure or to have failed may be replaced.

In many installations, the battery cells are kept at a reasonably constant ambient temperature of approximately 77° Fahrenheit (25° Celsius). Most battery types obtain their best performance, and have a longer life at this normalized temperature. Additionally, these battery types have been characterized at this normalized temperature. However, in some applications these batteries are not housed in a controlled environment. In some installations, these batteries may be installed in metal enclosures with no environmental protection. In these situations, the batteries see the full extent of the external environmental conditions and may be exposed to temperature variations of 30° to 120° Fahrenheit or more. The ohmic value of lead acid batteries varies considerably over these temperature ranges. Some battery types vary by 50% or more over this expected temperature range of 30° to 120° Fahrenheit. This variation makes regular monitoring difficult in determining whether ohmic value has risen due to temperature or due to changes in the state-of-health of the battery cell.

An ideal goal of a battery monitoring system would be to monitor the performance of the battery cells as though all measurements were taken at the normalized temperature. This ensures the state-of-health data is accurate even if the battery cells are exposed to broad temperature variations for extended periods of time. Disclosed herein are methods, devices, and systems using the temperature of the battery cell (i.e. electrolyte) to adjust the ohmic value measurement to a normalized value that would be measured if the electrolyte temperature was held constant at its characterized (i.e. normalized) temperature (e.g. 77° Fahrenheit). To better facilitate this goal, the battery monitoring system needs to measure the temperature of the battery environment. This can be done by measuring the ambient air in which the batteries are situated, measuring the negative post temperature of the battery, and/or measuring multiple points on and around the battery cells over extended time intervals. For example, the glass or plastic cases of the battery cells may be monitored for temperature and/or a probe may be inserted directly into the electrolytes to obtain temperature data. The extended time intervals may be two, four, or even twenty-four hour intervals depending on the battery size and the variance in ambient temperatures. Using this data and one or more algorithms, a computing device can then determine (i.e. estimate) a temperature of the electrolyte that takes into account a large thermal mass of the battery cells. The computing device may then calculate an estimated battery electrolyte temperature at which the ohmic value measurement was made. Next the computing device may compensate the measurement to what the ohmic value would have been at the normalized temperature. As such, the state-of-health can be determined and reported using a normalized alarm threshold.

For example, a computing device includes a memory and at least one processor configured for determining a state-of-health of one or more battery cells. The computing device is configured for receiving measured temperature data and measured ohmic value data associated with a battery cell over a battery monitoring network. The measured temperature data includes ambient air temperature data and negative battery post temperature data. Next the computing device determines an estimated battery cell electrolyte temperature based on the measured temperature data and then determines a normalized ohmic value based on the measured ohmic value data and the estimated battery cell electrolyte temperature. The normalized ohmic value is then determined as if the measurement were made at a normalized temperature (e.g. 77° Fahrenheit). Next the computing device, transmits directly or indirectly to a graphical user interface (GUI) and/or a battery log an indication of a state-of-health of the battery cell based upon the normalized ohmic value being greater than a normalized maximum ohmic value. The normalized maximum ohmic value is indicative of an abnormal state-of-health of the battery cell for the normalized temperature. The computing device may also determine a temperature compensated maximum ohmic value. In this scenario, the device determines the state-of-health based on the measured ohmic value being greater than the temperature compensated maximum ohmic value.

Battery profiles of different battery types may be modeled to determine thermal mass and response to ambient temperature changes. Profiles may be developed that use formulas or lookup tables for each battery type. Using the profiles, ohmic value measurements may be compensated for any reasonable temperature within the operating range of each battery type. Temperatures measurements may also be made from many different locations on and/or around each battery cell to better estimated the electrolyte temperature. In some embodiments a sensor may be installed within the cell for a more accurate electrolyte temperature. Temperature measurements may also be made over long time intervals to better estimate the electrolyte temperature. During the modeling process, ohmic value data may be discarded where excessive temperature variations are observed.

Temperature and ohmic value measurements and their associated profiles may be carried forward to future battery installations. Ohmic value measurements and or associated alarm thresholds may also be adjusted based on individual customer requirements. In some embodiments, the ohmic value measurement may routinely be made at the same electrolyte temperature from the break-in period through service life to avoid the need to compensate for temperature variations.

FIG. 1 depicts a block diagram illustrating a system 100 in accordance with embodiments of the present disclosure. The system includes a computing device 102 that is configured to receive a temperature measurement from an ambient temperature sensor 104 that is collocated with at least one battery cell 106. The computing device 102 is also configured to receive a negative post temperature measurement and an ohmic value measurement from a battery post temperature sensor and ohmic value measurement device 108. In some embodiments, the battery post temperature sensor and ohmic value measurement device 108 may be two devices.

To measure an ohmic value of the battery cell 106, the battery post temperature sensor and ohmic value measurement device 108 may induce a current either DC or at a predetermined frequency for a predetermined period of time while measuring a voltage across the battery cell 106 filtered to the predetermined frequency. In some embodiments, the battery post temperature sensor and ohmic value measurement device 108 may utilize separate current and voltage leads to increase the accuracy of the ohmic value measurement.

The ambient temperature sensor 104 and the battery post temperature sensor and ohmic value measurement device 108 may be configured to communicate with the computing device 102 over a fiber optic network. Multiple sensors may be configured with optic fibers as a loop, linear, or tree configuration to form the fiber optic network. In other embodiments, the network may be an electrical network such as an RS-485 network. In further embodiments, the network may be a wireless network. The wireless network may include 2G, 3G, 4G, and/or 5G technologies. In other embodiments the wireless network may include Wi-Fi technologies such as 802.11a, 802.11b/g/n, and/or 802.11ac circuitry. The wireless network may also include wireless personal area network (WPAN) technologies such as Zig-Bee® and/or Bluetooth® technologies. In some embodiments (not shown in FIG. 1), a sensor aggregation device may be configured between the ambient temperature sensor 104, the battery post temperature sensor and ohmic value measurement device 108, and the computing device 102. The sensor aggregation device may communicate with the computing device 102 over a local area network (LAN) and/or a wide area network (WAN). The WAN may include the Internet.

The computing device 102 is further configured to communicate with a GUI 110 and a battery log 112. The battery log 112 and GUI 110 are configured to receive measurements and state-of-health status of at least the battery cell 106. In some embodiments, the battery log 112 may store one or more profiles for the battery cell 106. The one of more profiles may be initially provided by a manufacturer of the battery cell 106 and/or developed through measurement over a break-in period after installation of the battery cell 106 and/or from one or more previous installations using the same or similar battery type.

The GUI 110 may be provided by a personal computer, a laptop, a tablet, or the like. The GUI may be further provided by a web browser such as a Microsoft Internet Explorer® browser, a Microsoft Edge® browser, an Apple Safari® browser, a Google Chrome® browser, a Mozilla Firefox® browser, an Opera® browser, or the like. In other embodiments, the GUI may be further provided by a dedicated application developed specifically for battery monitoring systems.

The battery log 112 may be integrated with the computing device and/or may be implemented as a database hosted on a different computing device. For example, the database may be an open source database such as the MongoDB® database, the PostgreSQL® database, or the like.

The computing device 102 may be provided by a server and may be implemented within a cloud computing environment such as the Microsoft Azure®, the Amazon Web Services® (AWS), or the like cloud computing data center environments. The computing device may be implemented as a virtual server such as an Ubuntu® server. The server may also be configured to be hosted within a virtual container. For example, the virtual container may be the Docker® virtual container or the like. In some embodiments, the virtual server and/or virtual container may be distributed over a plurality of hardware servers using hypervisor technology.

In other embodiments, the computing device 102 may be a personal computer, a microcontroller, a proportional-integral-derivative (PID) controller, or any suitable processing device. The GUI 110 and the computing device 102 may be integrated as one device. The GUI 110 and the battery log 112 may communicate with the computing device 102 over a network with one or more network interfaces (not shown in FIG. 1). The one or more network interfaces may be one or more WAN interfaces, LAN interfaces, wired interfaces, wireless interfaces, and/or optical interfaces. Additionally, the one or more network interfaces may use one or more transfer protocols such as a hypertext transfer protocol (HTTP) session, an HTTP secure (HTTPS) session, a secure sockets layer (SSL) protocol session, a transport layer security (TLS) protocol session, a datagram transport layer security (DTLS) protocol session, a file transfer protocol (FTP) session, a user datagram protocol (UDP), a transport control protocol (TCP), or a remote direct memory access (RDMA) transfer protocol. In some embodiments, one or more of the network interfaces may be configured to communicate over the Internet.

Figure 2:
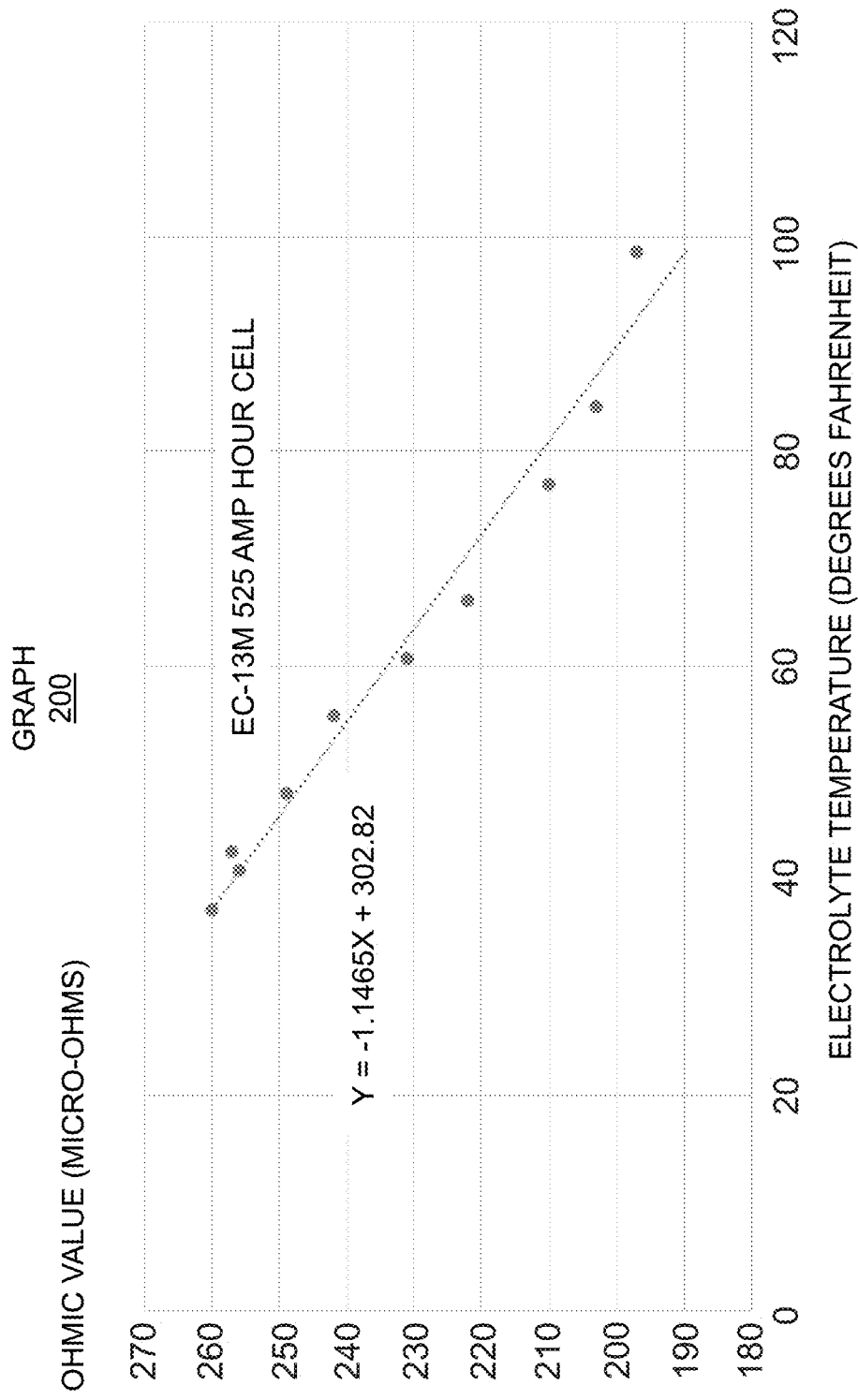
FIG. 2 depicts a graph in accordance with embodiments of the present disclosure.

FIG. 2 depicts a graph 200 illustrating ohmic value (y) measured over temperature (x) for the EnerSys® EC-13M 525 amp hour battery cell in accordance with embodiments of the present disclosure. The measurements may be approximated via a simple linear regression with the following equation:

$$y = -1.1465x + 302.82$$

When the ohmic value measurements are normalized to 77° Fahrenheit an accuracy of approximately two percent is maintained as illustrated in TABLE I.

TABLE I

| C | F | Ohmic | calculated | Normalised Ohmic at 77 F. | Error | Error |
|---|---|-------|------------|---------------------------|-------|-------|
| 3 | 37 | 260 | 260 | 212 | 2 | 1.2% |
| 5 | 41 | 256 | 256 | 213 | 3 | 1.3% |
| 6 | 43 | 257 | 254 | 216 | 6 | 2.8% |
| 9 | 48 | 249 | 248 | 214 | 4 | 2.1% |
| 13 | 55 | 242 | 239 | 216 | 6 | 2.9% |
| 16 | 61 | 231 | 233 | 212 | 2 | 0.7% |
| 19 | 66 | 222 | 227 | 209 | -1 | -0.5% |
| 25 | 77 | 210 | 215 | 210 | 0 | 0.0% |
| 29 | 84 | 203 | 206 | 212 | 2 | 0.8% |
| 37 | 99 | 197 | 190 | 223 | 13 | 6.2% | spread 63
% change 32%

Figure 3:
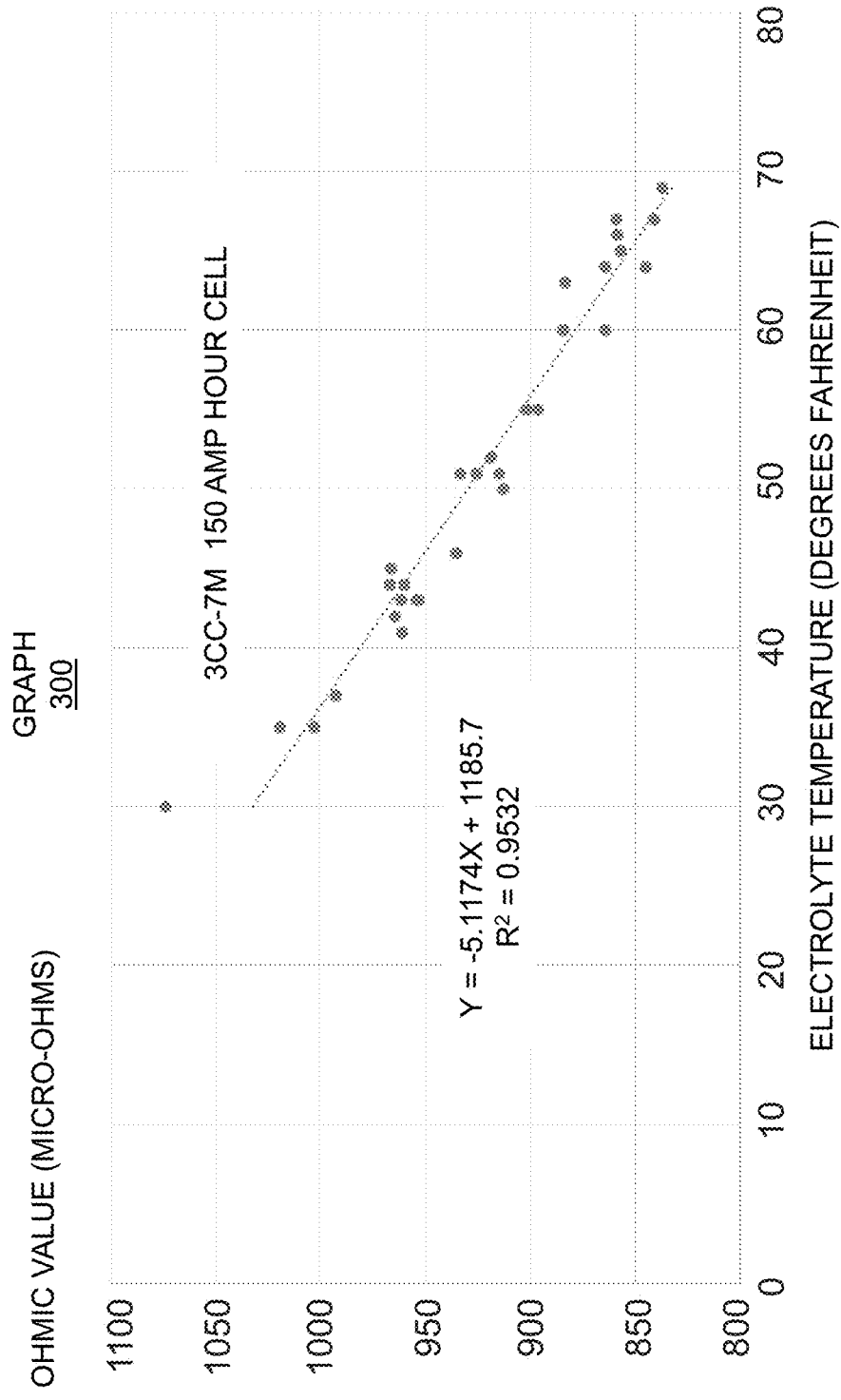
FIG. 3 depicts a graph in accordance with embodiments of the present disclosure.

FIG. 3 depicts a graph 300 illustrating ohmic value (y) measured over temperature (x) for the EnerSys® 3CC-7M 150 amp hour battery cell in accordance with embodiments of the present disclosure. The measurements may be approximated via a simple linear regression with the following equation:

$$y = -5.1174x + 1185.7$$

TABLE II provides example ohmic value measurements and normalizations for a string of battery cells at various temperatures.

TABLE II

| date | F. | Average Ohmic for the String | Average Ohmic Normalized to 50 F. |
| --- | --- | --- | --- |
| Dec. 4, 2017 0:00 | 60 | 884 | 935 |
| Dec. 5, 2017 0:00 | 67 | 858 | 945 |
| Dec. 6, 2017 0:00 | 66 | 858 | 940 |
| Dec. 7, 2017 0:00 | 44 | 960 | 929 |
| Dec. 8, 2017 0:00 | 44 | 967 | 936 |
| Dec. 9, 2017 0:00 | 35 | 1019 | 943 |
| Dec. 10, 2017 0:00 | 37 | 992 | 926 |
| Dec. 11, 2017 0:00 | 43 | 954 | 918 |
| Dec. 12, 2017 0:00 | 55 | 902 | 927 |
| Dec. 13, 2017 0:00 | 50 | 913 | 913 |
| Dec. 14, 2017 0:00 | 46 | 935 | 915 |
| Dec. 15, 2017 0:00 | 51 | 915 | 920 |
| Dec. 16, 2017 0:00 | 43 | 953 | 917 |
| Dec. 17, 2017 0:00 | 52 | 919 | 929 |
| Dec. 18, 2017 0:00 | 65 | 857 | 933 |
| Dec. 19, 2017 0:00 | 64 | 864 | 936 |
| Dec. 20, 2017 0:00 | 67 | 841 | 928 |
| Dec. 21, 2017 0:00 | 64 | 845 | 916 |
| Dec. 22, 2017 0:00 | 63 | 883 | 950 |
| Dec. 23, 2017 0:00 | 69 | 837 | 934 |
| Dec. 24, 2017 0:00 | 60 | 864 | 915 |
| Dec. 25, 2017 0:00 | 55 | 896 | 922 |
| Dec. 26, 2017 0:00 | 42 | 964 | 923 |
| Dec. 27, 2017 0:00 | 51 | 933 | 938 |
| Dec. 28, 2017 0:00 | 43 | 961 | 925 |
| Dec. 29, 2017 0:00 | 45 | 966 | 940 |
| Dec. 30, 2017 0:00 | 41 | 961 | 915 |
| Dec. 31, 2017 0:00 | 51 | 925 | 930 |
| Jan. 1, 2018 0:00 | 35 | 1003 | 926 |
| Jan. 2, 2018 0:00 | 30 | 1074 | 930 |
| variation | | 237 | 41 |
| | | 27% | 4% |

Figure 4:
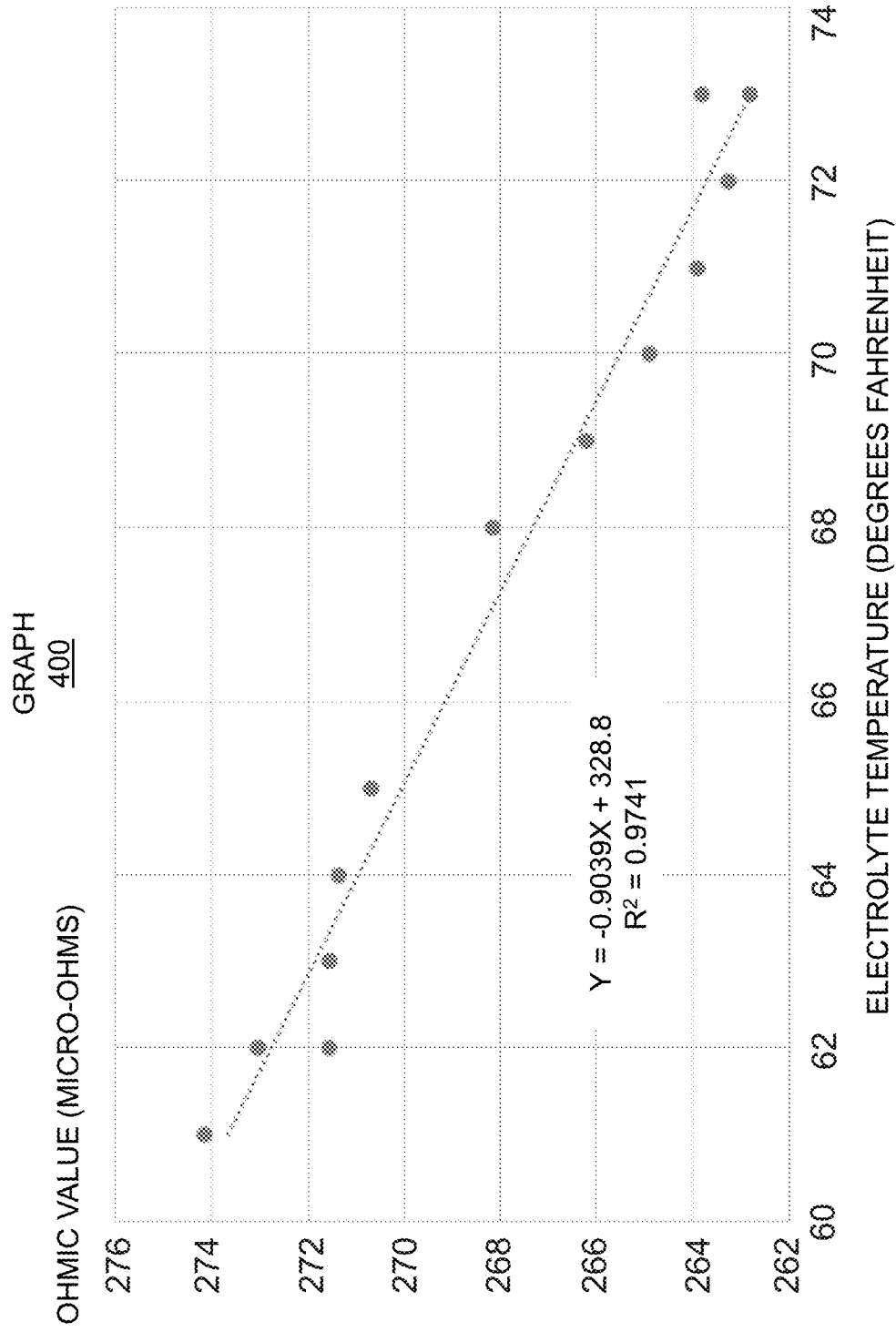
FIG. 4 depicts a graph in accordance with embodiments of the present disclosure.

FIG. 4 depicts a graph 400 illustrating ohmic value (y) measured over temperature (x) for another battery cell in accordance with embodiments of the present disclosure. The measurements may be approximated via a simple linear regression with the following equation:

$$y = -0.9039x + 328.8$$

Figure 5:
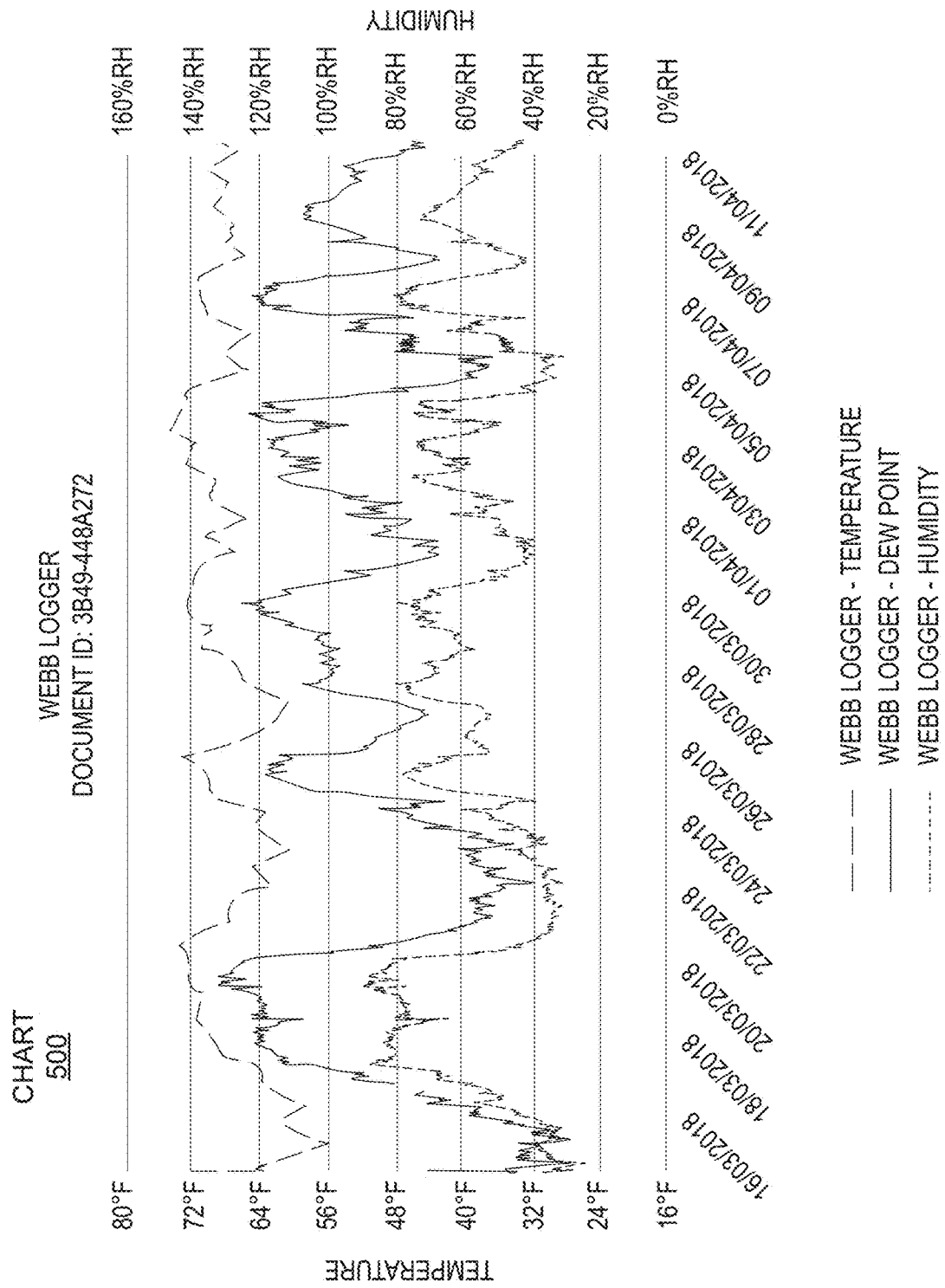
FIG. 5 depicts a graph in accordance with embodiments of the present disclosure.

FIG. 5 depicts a chart 500 illustrating environmental changes or temperature, humidity, and dew point over time for a non-climate controlled environment for housing battery cells in accordance with embodiments of the present disclosure.

TABLE III provides an example of average ohmic value measurements over several days and temperatures for a string of 60 battery cells. The associated normalized ohmic values show the impact of temperature compensation on a state-of-health determination based on ohmic value.

TABLE III

| date | temp F. | Average Ohmic of the String | Normalised to 77 F. Ohmic |
| --- | --- | --- | --- |
| Mar. 15, 2018 0:00 | 62 | 273 | 261 |
| Mar. 16, 2018 0:00 | 61 | 274 | 261 |
| Mar. 17, 2018 0:00 | 63 | 272 | 260 |
| Mar. 18, 2018 0:00 | 69 | 266 | 260 |
| Mar. 19, 2018 0:00 | 71 | 264 | 259 |
| Mar. 20, 2018 0:00 | 73 | 263 | 260 |
| Mar. 21, 2018 0:00 | 73 | 264 | 261 |
| Mar. 22, 2018 0:00 | 68 | 268 | 261 |
| Mar. 23, 2018 0:00 | 65 | 271 | 261 |
| Mar. 24, 2018 0:00 | 64 | 271 | 261 |
| Mar. 25, 2018 0:00 | 70 | 265 | 259 |
| Mar. 26, 2018 0:00 | 72 | 263 | 259 |
| Mar. 27, 2018 0:00 | 62 | 272 | 260 |
| Variation | | 12 | 3 |
| | | 5% | 1% |

Figure 6:
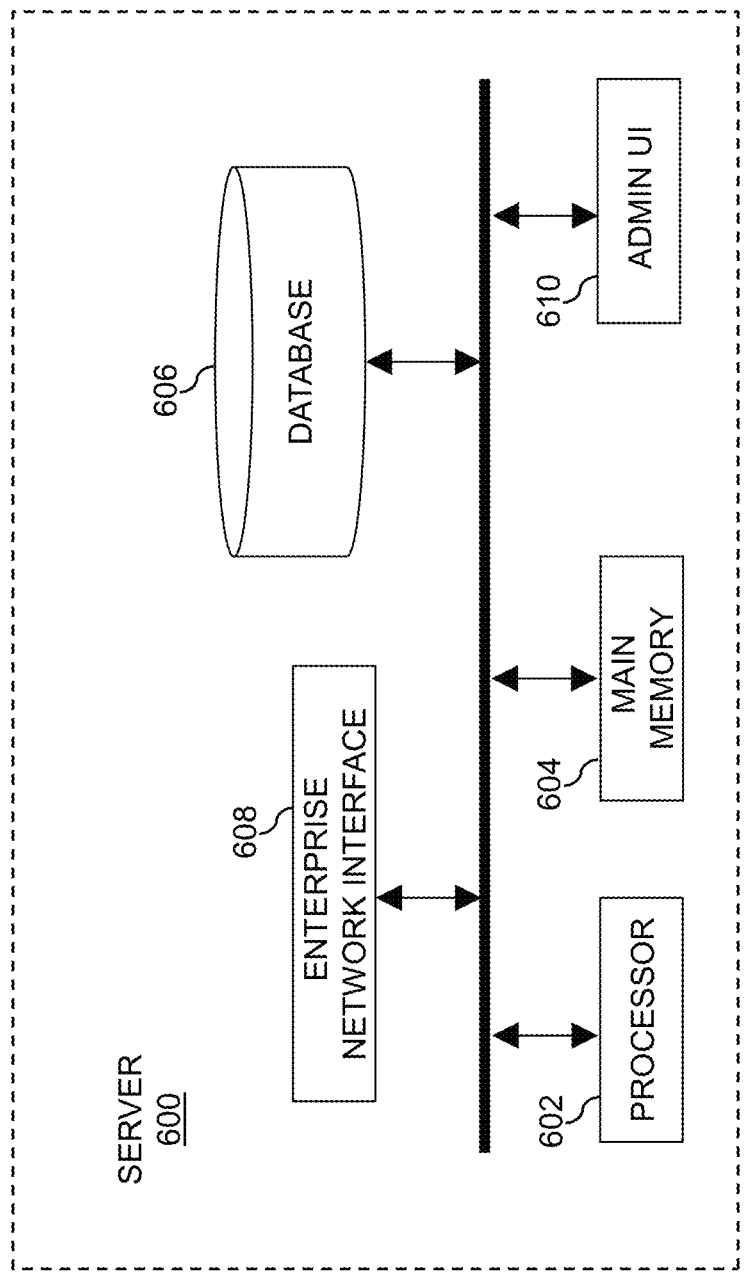
FIG. 6 depicts a block diagram illustrating a server in accordance with embodiments of the present disclosure.

FIG. 6 depicts a block diagram illustrating components of a server 600 in accordance with embodiments of the present disclosure. The server 600 may be configured to provide the computing device 102 of FIG. 1. The server 600 may include at least one of a processor 602, a main memory 604, a database 606, an enterprise network interface 608, and an administration user interface (UI) 610.

The processor 602 may be a multi-core server class processor suitable for hardware virtualization. The processor may support at least a 64-bit architecture and a single instruction multiple data (SIMD) instruction set. The main memory 604 may include a combination of volatile memory (e.g. random access memory) and non-volatile memory (e.g. flash memory). The database 606 may include one or more hard drives. The database 606 may provide the battery log 112 of FIG. 1.

The enterprise network interface 608 may provide one or more high-speed communication ports to enterprise switches, routers, and/or network storage appliances. The enterprise network interface 608 may include high-speed optical Ethernet, InfiniBand (IB), Internet Small Computer System Interface iSCSI, and/or Fibre Channel interfaces. The administration UI may support local and/or remote configuration of the server 600 by a network administrator. The server 600, when configured as the computing device 102, is transformed to provide a machine that solves the problem to better determine the state-of-health of battery systems over extended temperature ranges.

Figure 7:
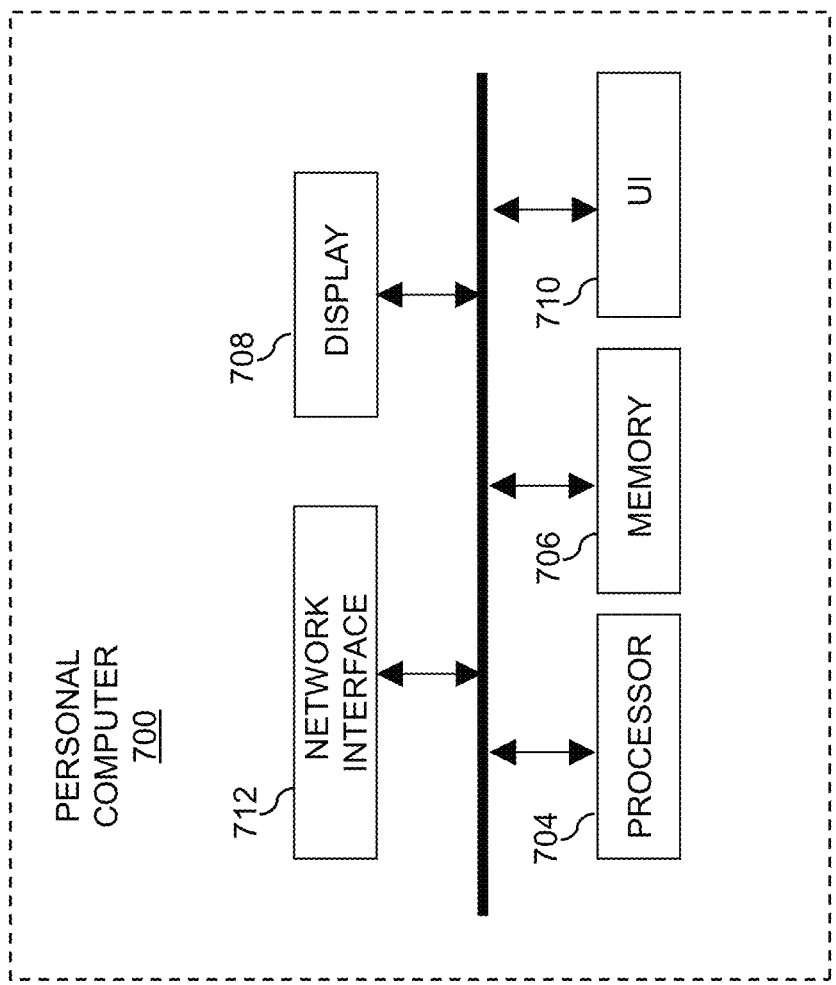
FIG. 7 depicts a block diagram illustrating a personal computer in accordance with embodiments of the present disclosure.

FIG. 7 depicts a block diagram illustrating a personal computer 700 in accordance with embodiments of the present disclosure. The personal computer 700 may be configured to provide the computing device 102 and/or the GUI 110 of FIG. 1. The personal computer 700 may include at least a processor 704, a memory 706, a display 708, a user interface (UI) 710, and a network interface 712. The personal computer 700 may include an operating system such as a Windows® OS, a Macintosh® OS, a Linux® OS, or the like. The memory 706 may include a combination of volatile memory (e.g. random access memory) and non-volatile memory (e.g. solid state drive and/or hard drives). The display 708 may be an external display (e.g. computer monitor) or internal display (e.g. laptop). The UI 710 may include a keyboard, and a pointing device (e.g. mouse). The network interface 712 may be a wired Ethernet interface or a Wi-Fi interface. The personal computer 700 may be configured to access the server 600 of FIG. 6 and/or remote memory (e.g. network storage and/or cloud storage) via the network interface 712. The personal computer 700, when configured as the computing device 102, is transformed to provide a machine that solves the problem to better determine the state-of-health of battery systems over extended temperature ranges.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including object oriented and/or procedural programming languages. For example, programming languages may include, but are not limited to: Ruby, JavaScript, Java, Python, Ruby, PHP, C, C++, C #, Objective-C, Go, Scala, Swift, Kotlin, OCaml, or the like.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method implemented on at least one computing device for determining a battery cell state-of-health status within a non-climate controlled environment; the method comprising:
    receiving first measured temperature data associated with a first battery cell having a first battery cell electrolyte and a first battery thermal mass, wherein the first measured temperature data comprises:
        a first temperature value recorded at a first location within the non-climate controlled environment, at a first time, and external to the first battery cell electrolyte; and
        a second temperature value recorded at the first location at a second time, and external to the first battery cell electrolyte;
    receiving first measured ohmic value data associated with the first battery cell and the first measured temperature data;
    estimating a first battery cell electrolyte temperature value based on the first battery thermal mass, the first temperature value, and the second temperature value;
    determining a first normalized ohmic value based at least partially on the first measured ohmic value data, a temperature coefficient, and a delta of the first battery cell electrolyte temperature value and a normalized temperature and; and
    transmitting, to at least one of a graphical user interface (GUI) and a battery log, an indication of a state-of-health of the first battery cell based upon the first normalized ohmic value being greater than a normalized maximum ohmic value, wherein:
        the normalized maximum ohmic value is indicative of an abnormal state-of-health of the first battery cell for the normalized temperature.

2. The method of claim 1, wherein the first battery cell is a lead acid battery cell implemented in a battery container.

3. The method of claim 2, wherein the first measured temperature data comprises first ambient air temperature data and first negative post temperature data associated with the first battery cell.

4. The method of claim 3, wherein the first measured temperature data is collected over an interval greater than an hour.

5. The method of claim 1, wherein the temperature coefficient is a value between −0.9 and −2.0 micro-ohms per degree Fahrenheit.

6. The method of claim 1, wherein the temperature coefficient is determined by the computing device during a battery break-in period.

7. The method of claim 6, wherein the battery break-in period is less than six months after initial battery cell installation.

8. The method of claim 6, wherein the temperature coefficient is further determined by the computing device over an ambient temperature range greater than 40 degrees Fahrenheit.

9. The method of claim 1 further comprising receiving a first battery type and the temperature coefficient is based upon the first battery type.

10. The method of claim 1, wherein the first normalized ohmic value is determined using an algorithm including, a first battery type associated with the first battery cell, and a delta of the first battery cell electrolyte temperature value and the normalized temperature.

11. The method of claim 10, wherein the algorithm includes at least one of a sigmoid function, a linear function, a quadratic function, a power function, a polynomial function, a rational function, an exponential function, a logarithmic function, and a sinusoidal function.

12. The method of claim 10, wherein the algorithm is implemented using a lookup table.

13. The method of claim 1, wherein the normalized temperature is between 70 and 80 degrees Fahrenheit.

14. The method of claim 1, wherein determining the first normalized ohmic value is further based at least partially upon an age of the first battery cell.

15. The method of claim 1, wherein the normalized maximum ohmic value is adjusted based upon at least one an age of the first battery cell and a specific gravity of the first battery cell.

16. The method of claim 1 further comprising:
    receiving second measured temperature data associated with a second battery cell that is collocated with the first battery cell; and
    determining the first battery cell electrolyte temperature value is further based on the second measured temperature data associated with the second battery cell.

17. The method of claim 16, wherein the second measured temperature data includes second negative post temperature data associated with the second battery cell.

18. The method of claim 17, wherein the second measured temperature data includes second ambient air temperature data associated with the second battery cell.

19. The method of claim 16, wherein the second battery cell is electrically coupled in series with the first battery cell.

20. The method of claim 1 further comprising:
    receiving second measured temperature data associated with a second battery cell having a second battery cell electrolyte and a second battery thermal mass, wherein the first measured temperature data comprises:
        a third temperature value recorded at a second location within the non-climate controlled environment, at a third time, and external to the second battery cell electrolyte; and
        a fourth temperature value recorded at the second location at a fourth time, and external to the second battery cell electrolyte;
    receiving second measured ohmic value data associated with the second battery cell and the second measured temperature data;
    estimating a second battery cell electrolyte temperature value based on the second battery thermal mass, the third temperature value, and the fourth temperature value;
    determining a second normalized ohmic value based at least partially on the first measured ohmic value data and the second battery cell electrolyte temperature value, wherein the second normalized ohmic value is related to the normalized temperature; and
    transmitting, to at least one of the GUI and the battery log, an indication of a state-of-health of the second battery cell based upon the second normalized ohmic value being greater than the normalized maximum ohmic value and the first normalized ohmic value being less than the normalized maximum ohmic value.

21. The method of claim 1, wherein determining the first normalized ohmic value is further based on determining a steady-state temperature status using a known thermal mass of the first battery cell.

22. The method of claim 1, wherein the first measured ohmic value data associated with the first battery cell and the first measured temperature data is based on a predetermined temperature value and a known temperature coefficient for the predetermined temperature value.

23. The method of claim 1, wherein the first location is at least one of an ambient air location and a battery post location of the first battery cell.

24. A computing device for determining a battery cell state-of-health status within a non-climate controlled environment, the computing device comprising:
a memory; and
at least one processor configured for:
receiving first measured temperature data associated with a first battery cell having a first battery cell electrolyte and a first battery thermal mass, wherein the first measured temperature data comprises:
a first temperature value recorded at a first location within the non-climate controlled environment, at a first time, and external to the first battery cell electrolyte; and
a second temperature value recorded at the first location at a second time, and external to the first battery cell electrolyte;
receiving first measured ohmic value data associated with the first battery cell and the first measured temperature data;
estimating a first battery cell electrolyte temperature value based on the first battery thermal mass, the first temperature value, and the second temperature value;
determining a first normalized ohmic value based at least partially upon the first measured ohmic value data, a temperature coefficient, and a delta of the first battery cell electrolyte temperature value and a normalized temperature; and
transmitting, to at least one of a graphical user interface (GUI) and a battery log, an indication of a state-of-health of the first battery cell based upon the first normalized ohmic value being greater than a normalized maximum ohmic value, wherein:
the normalized maximum ohmic value is indicative of an abnormal state-of-health of the first battery cell for the normalized temperature.

25. A non-transitory computer-readable storage medium, the non-transitory computer-readable storage medium storing instructions to be implemented on at least one computing device including at least one processor, the instructions when executed by the at least one processor cause the at least one computing device to perform a method of determining a battery cell state-of-health status within a non-climate controlled environment; the method comprising:
receiving first measured temperature data associated with a first battery cell having a first battery cell electrolyte and a first battery thermal mass, wherein the first measured temperature data comprises:
a first temperature value recorded at a first location within the non-climate controlled environment, at a first time, and external to the first battery cell electrolyte; and
a second temperature value recorded at the first location at a second time, and external to the first battery cell electrolyte;
receiving first measured ohmic value data associated with the first battery cell and the first measured temperature data;
estimating a first battery cell electrolyte temperature value based on the first battery thermal mass, the first temperature value, and the second temperature value;
determining a first normalized ohmic value based at least partially upon the first measured ohmic value data, a temperature coefficient, and a delta of the first battery cell electrolyte temperature value and a normalized temperature; and
transmitting, to at least one of a graphical user interface (GUI) and a battery log, an indication of a state-of-health of the first battery cell based upon the first normalized ohmic value being greater than a normalized maximum ohmic value, wherein:
the normalized maximum ohmic value is indicative of an abnormal state-of-health of the first battery cell for the normalized temperature.

* * * * *